United States Patent [19]
Oh

[11] Patent Number: 5,825,210
[45] Date of Patent: Oct. 20, 1998

[54] SYMMETRICAL PHASE-FREQUENCY DETECTOR

[75] Inventor: Sung-Hun Oh, Phoenix, Ariz.

[73] Assignee: VLSI Technology, San Jose, Calif.

[21] Appl. No.: 738,805

[22] Filed: Oct. 28, 1996

[51] Int. Cl.$^6$ .................................................. H03D 13/00
[52] U.S. Cl. .......................................................... 327/12
[58] Field of Search ................................. 327/2, 3, 5, 7, 327/12, 39, 41, 43, 47, 49, 208, 210–212, 215, 217–219, 225; 326/112, 119, 121

[56] References Cited

U.S. PATENT DOCUMENTS

| | | | |
|---|---|---|---|
| 4,277,754 | 7/1981 | Minakuchi | 327/12 |
| 4,751,469 | 6/1988 | Nakagawa et al. | 327/12 |
| 4,928,026 | 5/1990 | Ebesyu | 327/12 |
| 5,059,833 | 10/1991 | Fujii | 327/12 |
| 5,420,544 | 5/1995 | Ishibashi | 327/12 |

FOREIGN PATENT DOCUMENTS

| | | | |
|---|---|---|---|
| 3-129921 | 6/1991 | Japan | 326/121 |
| 6-224739 | 8/1994 | Japan | 326/121 |

*Primary Examiner*—Timothy P. Callahan
*Assistant Examiner*—My-Trang Nu Ton
*Attorney, Agent, or Firm*—LaValle D. Ptak

[57] ABSTRACT

A phase-frequency detector for a phase-locked loop (PLL) circuit has symmetrical phase detection characteristics and produces symmetrical activation times on the "up" and "down" outputs for connection to a PLL charge pump circuit. The symmetrical characteristics are accomplished by using RS latch circuits at the outputs of the phase-frequency detector to provide the same loads and the same propagation delay for both the "up" and the "down" outputs. In addition, cross-wired sequential gates are used for at least some of the gates in the logic gate array of the detector to produce the same propagation delays in the gates.

9 Claims, 2 Drawing Sheets

SYMMETRICAL PHASE-FREQUENCY DETECTOR

BACKGROUND

Phase-frequency detector (PFD) circuits are widely used in phase-locked loop (PLL) circuits. The PFD circuits typically employ sequential logic for the phase-frequency detection to supply "up" and "down" signals to the charge pump of the local oscillator in a phase-locked loop. The inputs to the PFD circuits are the external clock signal, and the reference or feedback signal which is obtained from the output of the local voltage controlled oscillator (VCO) in the PLL circuit.

When the falling edge of the clock signal leads the falling edge of the feedback or reference signal, an "up" output is activated to a low level until the falling edge of the feedback reference signal arrives. Similarly, "down" output is activated when the feedback or reference signal leads the reference clock. Due to different propagation delays of the sequential logic gates, however, "upb" or "down" signal activation time in conventional PFD circuits becomes asymmetrical, depending upon which signal (clock signal or feedback reference signal) leads the falling edge.

To activate a charge pump circuit for a PLL system, the "up" signal must be inverted; while the "down" signal is non-inverting. This is standard. As a consequence, the propagation delays from the PFD output to the charge pump circuit inputs are different (as a result of the required inversion of the "up" signal). To overcome this difference, a delay element has been used in an effort to match the delay time. Process changes in the fabrication steps used in manufacturing the PFD circuit, however, make such a matched delay time hard to control. Although the propagation delay differences are slight, the difference in activation times for the charge pump circuit connected to the output of the PFD circuit results in different (VCO) control input voltages. This contributes to a condition known as PLL jitter.

At relatively low frequencies, the PLL jitter is not a significant problem. For high frequency PLL's, however, it is highly desirable that the PFD have phase detection characteristics which are as symmetrical as possible to produce symmetrical activation times.

PFD circuits use a number of coincidence gates (such as NAND gates) to provide the interactions between the clock signal and the feedback reference signal. When these gates are implemented in CMOS technology, slight differences exist in the pull down delays in response to transitions from the different inputs in the gates. This is caused by the asymmetric configuration of typical CMOS NAND gates or similar gates. An approach for eliminating these different delay times between the inputs to such NAND gates is disclosed in the article "Elimination of Process-dependent Clock Skew in CMOS VLSI", *Journal of Solid State Circuits*, Vol. SC-21, No. 5, October 1986, Pages 875–880. This article describes a "symmetricized" NAND gate in which the inputs to the cascaded chains of transistors in the gates are cross-coupled to a parallel chain of cascaded transistors; so that the net effect of the pull down delays in response to transitions at the different inputs is equalized or matched. Utilization of such cross-coupled inputs in the NAND gates in the PFDS, which are disclosed in this article, results in significant reductions in the skew between the activation times of "up" and "down" signals for the PFD.

It is desirable to provide phase-frequency detector circuit which overcomes the disadvantages of the prior art, and which has symmetrical phase detection characteristics and produces symmetrical activation times.

SUMMARY OF THE INVENTION

It is an object of this invention to provide an improved phase-frequency detector system.

It is another object of this invention to provide an improved phase-frequency detector system for use with a phase-locked loop (PLL) circuit.

It is another object of this invention to provide an improved phase-frequency detector circuit which has symmetrical phase detection characteristics and produces symmetrical activation times.

It is a further object of this invention to provide an improved CMOS phase-frequency detector circuit for a PLL system with symmetrical phase detection characteristics and producing symmetrical activation times.

In accordance with a preferred embodiment of the invention, a phase-frequency detector circuit for a phase-locked loop (PLL) circuit includes a source of reference signals and a source of clock signals. A logic gate array is coupled to receive input signals from the source of reference signals and from the source of clock signals. This array has an "up" output and a "down" output for connection to a charge pump circuit of a phase-locked loop (PLL). To produce symmetrical phase detection characteristics and symmetrical activation times, first and second RS latch circuits are provided. Each of these RS latch circuits has first and second inputs; and the circuits are identical. A connection is provided from the "up" output of the logic gate array through a first inverter to the first input of the first latch circuit. Another connection is provided from the "up" output of the logic gate array directly to the second input of the first latch circuit. A connection then is provided from a "down" output of the logic gate array through a second inverter to a second input of the second latch circuit; and connection is made directly from the "down" output of the logic gate array to the first input of the second latch circuit. Because of the different manner in which the "up" and "down" outputs are connected to the respective RS latch circuits, the same loads and propagation delays to signals supplied from the "up" and "down" outputs of the logic gate array exist; so that symmetrical activation times exist.

DETAILED DESCRIPTION

Figure 1:
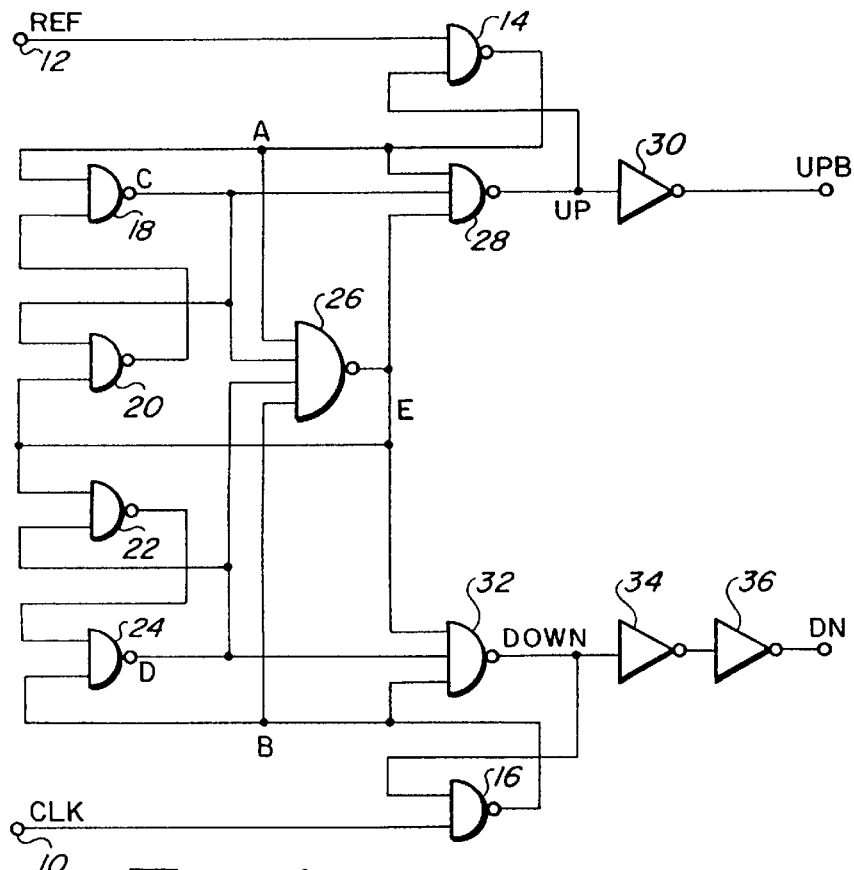
FIG. 1 is a schematic diagram of a phase-frequency detector circuit of the prior art.

Reference now should be made to the drawing, in which the same reference numbers are used in the different figures to designate the same components. FIG. 1 is a schematic diagram of a prior art sequential logic PFD (phase-frequency detector) circuit, which is widely used for phase-frequency detection in phase-locked loop (PLL) circuits to supply the "up" and "down" signals to the PLL charge pump coupled to the voltage controlled oscillator (VCO) of the PLL system. Since such PLL systems are well known, only the PFD circuit is shown in FIG. 1.

The circuit includes two input terminals, a clock input signal terminal 10 and a reference/feedback signal input terminal 12. These terminals are connected to one of the inputs of a pair of two input NAND gates 16 and 14, respectively. The output of the gate 16 is, in turn, coupled to one of three inputs of a "down" NAND gate 32. The output of the gate 14 is coupled to one of three inputs to an "up" NAND gate 28. In addition, the outputs of the gates 16 and 14 also comprise the "B" and "A" node inputs of a four-input NAND gate 26, and one of two inputs each of a respective pair of NAND gates 24 and 18. The NAND gate 24 is cross-coupled with a two-input NAND gate 22; and the NAND gate 18 is cross-coupled with a two-input NAND 20. In addition, the outputs of the NAND gates 18 and 24 constitute "C" and "D" node inputs, respectively, to the four-input NAND gate 26.

The output of the NAND gate 26 is supplied to the other two inputs of the NAND gates 20 and 22 and to the other of the three inputs of the NAND gates 28 and 32. As is well known, the operation of the interconnected gates, in response to the signals applied to the terminals 10 and 12, is such that when the falling edge of the reference signal 12 leads the falling edge of the clock signal on the terminal 10, the output of the gate 28 is activated to a low level until the falling edge of the feedback signal arrives. The "down" output from the three-input NAND gate 32 is activated to a high level during this same time interval as a result of the inputs applied to it from the outputs of the gates 16, 24 and 26. The reverse of these signal conditions occurs when the reference/feedback signals applied to the input 12 lead the clock signals applied to the input 10.

As is well known, in order to activate a charge pump circuit for a VCO, the "up" signal must be inverted, while the "down" signal is non-inverting. This is accomplished in the prior art circuit of FIG. 1 by the inverter circuit 30, placed between the output of the gate 28 and an "upb" output terminal which is coupled to the charge pump circuit (not shown). To compensate for the difference in propagation delays from the PFD output to the charge pump circuit, caused as a result of the addition of the inverter 30, a pair of cascaded inverters 34 and 36 are coupled to the output of the gate 32, between it and a "dn" output terminal connected to the charge pump circuit. The delay elements in the cascaded inverters 34 and 36 are designed to match the delay time of the single inverter 30. Process changes, however, in fabrication steps cause the match of the delay times of the cascaded inverters 34 and 36 to the delay time of the inverter 30 to be difficult to control. Consequently, the activation times for the charge pump circuit on the "upb" and "dn" output terminals of the circuit of FIG. 1 result in different VCO control input voltages, which contribute to PLL jitter in a system using the circuit of FIG. 1.

Figure 2:
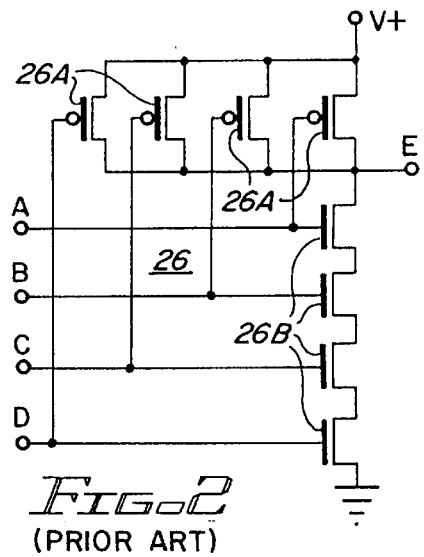
FIG. 2 is a detail of a four input NAND gate used in the circuit of FIG. 1.

Additional propagation delays also occur as a result of the conventional CMOS NAND gate configurations which are used with the circuit of FIG. 1. Such a gate configuration for the standard four-input NAND gate 26 is shown in FIG. 2. The four inputs, "A", "B", "C" and "D", which are applied to the input of the NAND gate 26 of FIG. 1, are shown in FIG. 2. As is well known, these inputs are applied to four parallel connected PMOS transistors 26A, which have their source-drain paths connected between Vcc and the output terminal "E". Since the PMOS transistors 26A are all connected in parallel, no differences in propagation times, as a result of the signals appearing on the four input terminals "A", "B", "C" and "D", take place. A different result, however, is obtained from the four series connected or cascaded NMOS transistors 26B, which are connected between the output terminal "E" and ground, as illustrated in FIG. 2. It is well known that the delay from the input "A" is shorter than that from input "B"; and the delay from input "B" is shorter than that from input "C", and so on. As a result of this, differences in pull down delay or response times occur when the input signals are applied to the various input terminals "A", "B," "C" and "D". While the situation is most significant with respect to the four-input NAND gate 26, the same situation arises for the two-input NAND gates 18 through 24 and the three-input NAND gates 28 and 32. All of these differences in delays result in different activation times in the signals ultimately applied to the "upb" and "dn" output terminals of the circuit.

Figure 3:
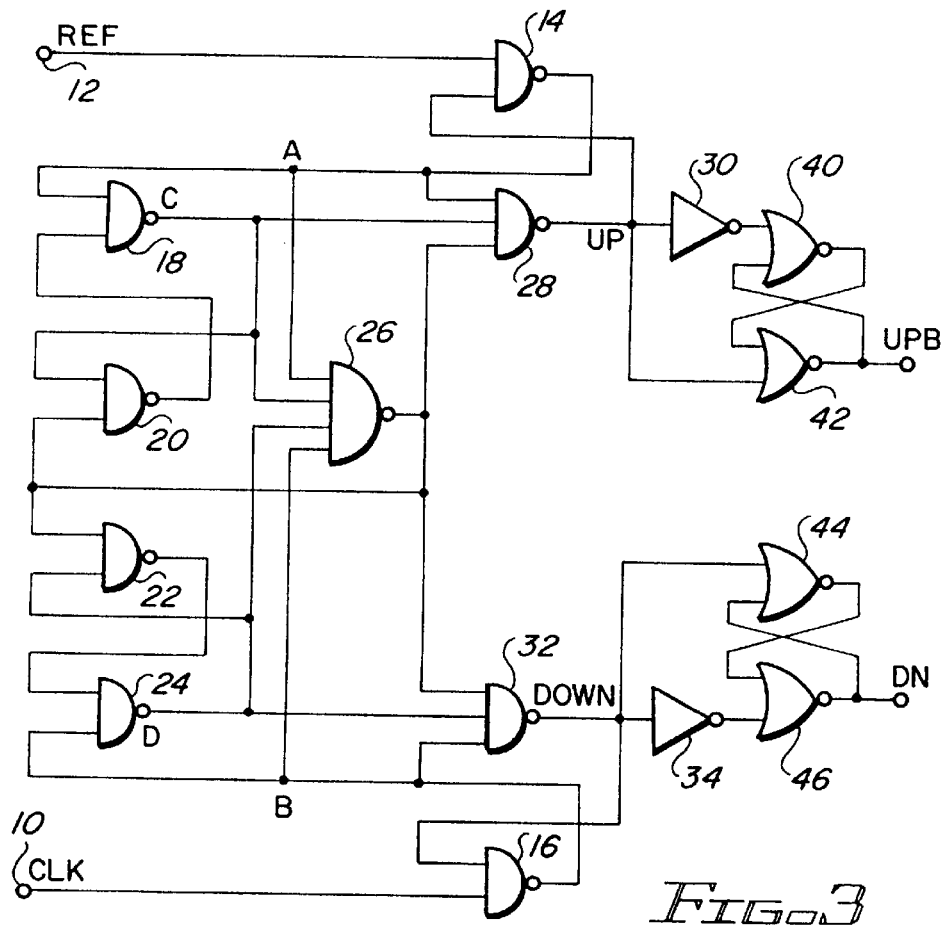
FIG. 3 schematic diagram of the preferred embodiment of the invention.
Figure 4:
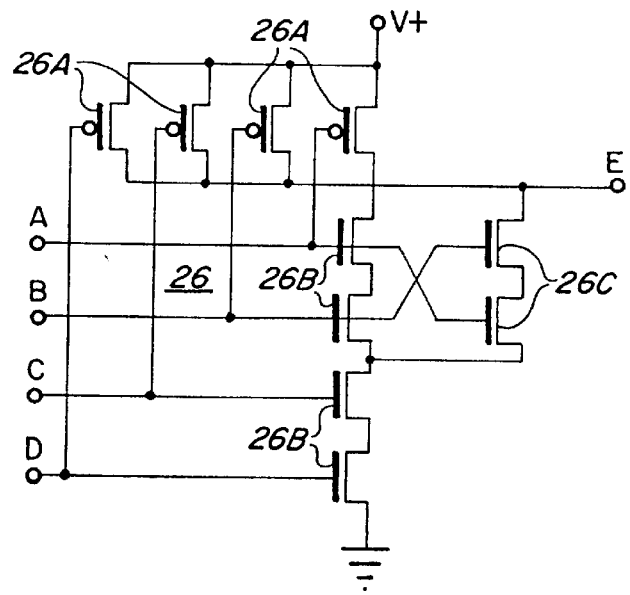
FIG. 4 is a detailed schematic diagram of a four input NAND gate used in the circuit of FIG. 3.

Reference now should be made to FIGS. 3 and 4, which disclose a PFD circuit having symmetrical phase detection characteristics and producing symmetrical activation times on the "upb" and "dn" output terminals connected to the charge pump of a PLL. In the circuit of FIG. 3, all of the phase-frequency detector gates are interconnected in the same manner as the gates in the circuit of FIG. 1. In FIG. 3, however, the outputs of the gates 28 and 32 are supplied to identical symmetrical output paths; so that the propagation delays between the outputs of the gates 28 and 32 and the respective "upb" and "dn" output terminals of the circuit are identical. This is accomplished by supplying the output of the gate 28 through an inverter 30 to the upper or first input of an RS latch comprising a pair of cross-coupled NOR gates 40 and 42. The non-inverted output of the gate 28 is applied directly to the lower or second input of the NOR gate 42 of the RS latch with the "up" output from the circuit being obtained from the output of the NOR gate 42, which has the uninverted output of the gate 28 applied to it.

For the "down" output, a similar circuit interconnection is employed. The output of the gate 32 is supplied through an inverter 34 to the lower or second input of an RS latch circuit comprising a pair of cross-coupled NOR gates 44 and 46. The output of the gate 32 is applied directly to the upper or first input of the gate 44; but the output applied to the "down" output terminal is obtained from the gate 46 (the one which is coupled to the output of the inverter 34).

By utilizing the RS latches 40/42 and 44/46 in the manner disclosed in FIG. 3, completely symmetrical operation of the circuit is obtained throughout. For the "upb" output, the gate of the latch (NOR gate 42), from which the output is obtained, is the one which has one input directly connected to the output of the gate 28. For the "dn" input, however, the gate of the latch, which is directly coupled to the output of the gate 32 (NOR gate 44), is not used as the output of the latch circuit; but, on the contrary, the other or opposite gate (NOR gate 46), which has an input connected to the output of the inverter 34, is the one used to produce the "dn" output from the circuit. Thus, the desired output signals are obtained in the desired manner, but without differences in activation times caused by different propagation delays through the circuit. The circuits are symmetrical.

In addition to the utilization of the RS latch circuits described above in conjunction with FIG. 3, the NAND gates used in the circuit of FIG. 3 are designed as symmetrical NAND gates, at least with respect to some of the elements. In situations where sufficient real estate is available, all of the NAND gates 18, 20, 22, 24, 26, 28 and 32 can be designed as symmetrical NAND gates. If real estate on the chip, however, is at a premium, some or all of the elements of the four-input NAND gate 26 and the three-input NAND gates 28 and 32 may be modified to the configuration shown in FIG. 4.

As is illustrated in FIG. 4, the N gates which are cascaded between the output terminal "E" and the ground terminal of the gate circuit are shown as a pair of parallel circuits 26B and 26C for at least the two inputs "A" and "B", with the gates of the circuits cross-coupled; so that the propagation delays of the input signals applied to the terminals "A" and "B" are identical. This results from the fact that the signal paths for the composite of the NMOS transistors 26B and 26C coupled to these gates are matched. Even if only the upper two inputs "A" and "B" are matched as shown in FIG. 4, the propagation delays or skew resulting from the operation of the gate 26 is significantly reduced over the configuration shown in FIG. 2. All of the two input NAND gates 18, 20, 22 and 24 also may be configured in the same manner as shown for the upper two inputs "A" and "B" of gate 26 in FIG. 4; and the same technique may be used for the three-input NAND gates 28 and 32 to match the falling propagations of the circuit paths in the NAND gates.

The propagation delays for input nodes "A", and "B" are different, due to the body effect of the NMOS transistors 26B of the standard circuit and 26B and 26C of the circuit of FIG. 4. By cross wiring the transistors 26B and 26C for the input nodes "A" and "B", the propagation delays resulting from the body effects of the NMOS transistors are matched or neutralized.

As noted above, all of the NMOS transistors of all of the NAND gates in the circuit of FIG. 3 may be cross wired if sufficient real estate is available on the chip. In addition, the PMOS side of the NOR gates 40, 42, 44 and 46 of the RS latches also can be cross wired to overcome or compensate for the different propagation delays resulting from body effect of the transistors used in these gates. Similarly, these techniques may be used for RS latches using two-input NAND gates.

Various other changes and modifications will occur to those skilled in the art for accomplishing substantially the same functions, in substantially the same way, to achieve substantially the same result, without departing from the true scope of the invention as defined in the appended claims.

What is claimed is:

1. A phase-frequency detector circuit for a phase-locked loop (PLL) circuit having symmetrical phase detection characteristics including in combination:
   a source of reference signals;
   a source of clock signals;
   a logic gate array coupled to receive input signals from said source of reference signals and from said source of clock signals, said logic gate array having an "up" output and a "down" output for connection to a charge pump circuit;
   a first RS latch circuit having an output and first and second inputs;
   a second RS latch circuit having an output and first and second inputs;
   first and second inverters;
   a connection from said "up" output of said logic gate array through said first inverter to the first input of said first latch circuit;
   a connection from said "up" output of said logic gate array directly to the second input of said first latch circuit;
   a connection from said "down" output of said logic gate array through said second inverter to the second input of said second latch circuit;
   a connection directly from said "down" output of said logic gate array to the first input of said second latch circuit; wherein said first and second RS latch circuits provide the same loads and propagation delays to signals supplied from said "up" and said "down" outputs of said logic gate array.

2. The combination according to claim 1 wherein each of said first and second RS latch circuits comprise first and second cross-coupled NOR gates, with the outputs of each of said RS latch circuits being obtained from the output of the second NOR gate of each of said first and second RS latch circuits, with the first input of each of said RS latch circuits being coupled with said first NOR gate of each of said latch circuits and the second input of each of said latch circuits being coupled with said second NOR gate of each of said latch circuits.

3. The combination according to claim 2 wherein said first and second NOR gates of said first and second latch circuits each comprise two input NOR gates with the output of said first NOR gate coupled with one of the inputs of said second NOR gate and the output of said second NOR gate coupled with one of the inputs of said first NOR gate in each of said RS latch circuits.

4. The combination according to claim 3 wherein at least some gates of said logic gate array include cross-wired inputs thereto to compensate for propagation delays for input signals applied to different inputs thereof.

5. The combination according to claim 4 wherein said gates of said logic array are CMOS NAND gates.

6. The combination according to claim 4 further including first and second supply terminals and wherein at least some of said gates of said logic gate array comprise at least first and second input terminals and an output terminal, and with first and second CMOS transistors of a first conductivity type, each having a source, a drain, and a gate, and with the source-drain paths thereof connected in parallel between said first supply terminal and said output terminal; with third and fourth CMOS transistors of a second conductivity type each having a source, a drain and a gate, with the source-drain paths thereof connected, in the order named, in series between said output terminal and said second supply terminal; with fifth and sixth CMOS transistors of said second conductivity type each having a source, a drain and a gate, with the source-drain paths thereof connected, in the order named, in series between said output terminal and said second supply voltage terminal; circuit connections between said first input terminal and the gates of said first, third and sixth transistors; and circuit connections between said second input terminal and the gates of said second, fourth and fifth transistors.

7. The combination according to claim 1 wherein at least some gates of said logic gate array include cross-wired inputs thereto to compensate for propagation delays for input signals applied to different inputs thereof.

8. The combination according to claim 7 wherein said gates of said logic array are CMOS NAND gates.

9. The combination according to claim 7 further including first and second supply terminals and wherein at least some of said gates of said logic gate array comprise at least first and second input terminals and an output terminal, and with first and second CMOS transistors of a first conductivity type, each having a source, a drain, and a gate, and with the source-drain paths thereof connected in parallel between said first supply terminal and said output terminal; with third and fourth CMOS transistors of a second conductivity type each having a source, a drain and a gate, with the source-drain paths thereof connected, in the order named, in series between said output terminal and said second supply terminal; with fifth and sixth CMOS transistors of said second conductivity type each having a source, a drain and a gate, with the source-drain paths thereof connected, in the order named, in series between said output terminal and said second supply voltage terminal; circuit connections between said first input terminal and the gates of said first, third and sixth transistors; and circuit connections between said second input terminal and the gates of said second, fourth and fifth transistors.

\* \* \* \* \*